(12) United States Patent
Mochizuki et al.

(10) Patent No.: US 7,488,927 B2
(45) Date of Patent: Feb. 10, 2009

(54) SEMICONDUCTOR INTEGRATED CIRCUIT DEVICE

(75) Inventors: Toshio Mochizuki, Tokyo (JP); Takanobu Ambo, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 170 days.

(21) Appl. No.: 11/698,163

(22) Filed: Jan. 26, 2007

(65) Prior Publication Data

US 2007/0229677 A1 Oct. 4, 2007

(30) Foreign Application Priority Data

Mar. 15, 2006 (JP) ............................. 2006-070310

(51) Int. Cl.
*H01L 27/00* (2006.01)
(52) U.S. Cl. .................................... 250/208.1; 348/241
(58) Field of Classification Search .............. 250/208.1; 348/241, 243
See application file for complete search history.

(56) References Cited

U.S. PATENT DOCUMENTS

| | | | | |
|---|---|---|---|---|
| 4,553,132 | A * | 11/1985 | Dingwall et al. | 341/136 |
| 6,351,187 | B1 * | 2/2002 | Lu | 330/255 |
| 6,445,322 | B2 * | 9/2002 | Watson | 341/144 |
| 6,774,942 | B1 * | 8/2004 | Salcedo et al. | 348/243 |
| 7,081,921 | B2 | 7/2006 | Nitta et al. | |
| 2004/0189843 | A1 * | 9/2004 | Holberg et al. | 348/294 |
| 2004/0196392 | A1 * | 10/2004 | Yahagi et al. | 348/241 |
| 2006/0044172 | A1 * | 3/2006 | Sasaki et al. | 341/161 |

FOREIGN PATENT DOCUMENTS

JP 2001-189892 A 7/2001

* cited by examiner

*Primary Examiner*—Georgia Y Epps
*Assistant Examiner*—Kevin Wyatt
(74) *Attorney, Agent, or Firm*—Miles & Stockbridge P.C.

(57) ABSTRACT

Disclosed herein is a semiconductor integrated circuit device such as a for-camera preprocessing LSI suitable for a semiconductor integrated circuit and having improved responsiveness. In a D/A converter circuit for generating a feedback signal for compensating for black level variation in a for-camera preprocessing LSI, first-conductivity-type MOSFETs as first current sources produce currents corresponding to digital signals. The digital signals are supplied to first-conductivity-type first differential MOSFETs and second-conductivity-type second differential MOSFETs, with the gates and drains of the first differential MOSFETs and the gates and drains of the second differential MOSFETs being connected together respectively. There is provided a differential amplifier circuit in which a bias voltage is supplied to a noninverting input terminal thereof and an inverting input terminal thereof is connected to an analog current output node which is the drains connected together of one sides of the first differential MOSFETs, and a resistive element is provided between the inverting input terminal and an output terminal thereof. A converted analog output voltage is generated at the output terminal, and a voltage equal to the bias voltage is supplied to drains of the other sides of the first differential MOSFETs.

9 Claims, 6 Drawing Sheets

SEMICONDUCTOR INTEGRATED CIRCUIT DEVICE

CROSS-REFERENCE TO RELATED APPLICATION

The present application claims priority from Japanese patent application No. 2006-070310 filed on Mar. 15, 2006, the content of which is hereby incorporated by reference into this application.

BACKGROUND OF THE INVENTION

The present invention relates to a semiconductor integrated circuit device, and more particularly, to a technique that is effective for use in a for-camera preprocessing LSI (Analog Front End) including a correlated dual sampling (CDS) circuit and a variable gain amplifier such as a programmable gain amplifier (PGA).

For example, Japanese Unexamined Patent Publication No. 2001-189892 (patent document 1) describes an example of a front-end signal processor for digitally providing a clamp offset in processing a signal from an image sensor. As shown in FIG. 3 of patent document 1, a digital brightness signal subjected to compensation for black level variation is converted by a DAC into an analog signal, which is integrated by a capacitor through a gate, so that a feedback voltage for compensating for a black level is stored.

[Patent document 1] Japanese Unexamined Patent Publication No. 2001-189892

SUMMARY OF THE INVENTION

In patent document 1, details about the DAC are not described. However, for example, in a circuit with a resistor ladder which is a typical DAC, a signal delay occurs so that high speediness becomes deteriorated. Further, since a feedback voltage for compensating for a black level is stored by integrating the signal in a capacitor, the necessity of storage for at least one line period of the signal from a CCD requires a large-capacitance capacitor. Consequently, an external capacitor of a large capacitance and contacts therefor are required for the for-camera preprocessing LSI.

The present inventors have investigated the use of a current-mode digital-to-analog (D/A) converter (hereinafter referred to simply as DAC) as shown in FIG. 7. In FIG. 7, a 3-bit DAC is illustrated as an example.

P-channel MOSFETs MP01, MP02, and MP03 for feeding currents I, 2I, and 4I having binary weights are provided at a power supply voltage VDD side. These currents I, 2I, and 4I form an analog current signal when digital signals D0, D1, and D2 and their inverted signals generated by inverter circuits N1 to N3 are supplied to the gates of P-channel type differential MOSFETs MP1 and MP2, differential MOSFETs MP3 and MP4, and differential MOSFETs MP5 and MP6 respectively for current switches. N-channel MOSFETs MN11, MN12, and MN13 for feeding currents I, 2I, and 4I having binary weights are provided at a circuit ground potential VSS side as well. These currents I, 2I, and 4I form an analog current signal when the digital signals D0, D1, and D2 and their inverted signals generated by the inverter circuits N1 to N3 are supplied to the gates of N-channel type differential MOSFETs MN1 and MN2, differential MOSFETs MN3 and MN4, and differential MOSFETs MN5 and MN6 respectively for current additions.

The differential MOSFETs MP1 and MP2 receive the digital signal D0 and its inverted signal at their gates respectively, and the differential MOSFETs MN1 and MN2 receive the digital signal D0 and its inverted signal at their gates respectively. The drains of the differential MOSFETs MP1 and MP2 are connected to the drains of the differential MOSFETs MN1 and MN2 respectively to produce positive current and negative current. The gates of the P-channel type differential MOSFETs MP1 and MP2 are connected to the gates of the N-channel type differential MOSFETs MN1 and MN2, respectively. Therefore, when the digital signal D0 is at a low level, the P-channel MOSFET MP1 is ON and the corresponding N-channel MOSFET MN1 is OFF. Since the inverted signal of the digital signal D0 is high, the P-channel MOSFET MP2 is OFF and the N-channel MOSFET MN2 is ON. Accordingly, the current I produced at the P-channel MOSFET MP01 flows through the P-channel MOSFET MP1 to be outputted as a positive current, whereas the current I produced at the N-channel MOSFET MN11 flows through the N-channel MOSFET MN2 to be outputted as a negative current.

Further, the differential MOSFETs MP3 and MP4 receive the digital signal D1 and its inverted signal at their gates, respectively, and the differential MOSFETs MN3 and MN4 receive the digital signal D1 and its inverted signal at their gates respectively. The drains of the differential MOSFETs MP3 and MP4 are connected to the drains of the differential MOSFETs MN3 and MN4 respectively to produce positive current and negative current. Furthermore, the differential MOSFETs MP5 and MP6 receive the digital signal D2 and its inverted signal at their gates respectively, and the differential MOSFETs MN5 and MN6 receive the digital signal D2 and its inverted signal at their gates respectively. The drains of the differential MOSFETs MP5 and MP6 are connected to the drains of the differential MOSFETs MN5 and MN6 respectively to produce positive current and negative current. Since the drains of the corresponding differential MOSFETs are connected together, the currents I, 2I, and 4I having binary weights are added to each other to be an analog current signal. These positive and negative currents flow through a resistor R1 provided between the inverting input terminal (−) and the output terminal of a differential amplifier circuit AMP1 and a resistor R2 provided at a similar differential amplifier circuit AMP2, thus producing analog voltages VT and VB at the output terminals of the differential amplifier circuits AMP1 and AMP2, respectively. Bias voltages VRT and VRB are supplied to the noninverting input terminals (+) of the differential amplifier circuits AMP1 and AMP2. Thereby, the differential amplifier circuit AMP1 produces the output voltage VT which becomes a positive or negative voltage in accordance with a positive or negative current flowing through the resistor R1, with the bias voltage VRT being the center. The differential amplifier circuit AMP2 produces the output voltage VB which becomes a positive or negative voltage in accordance with a positive or negative current flowing through the resistor R2, with the bias voltage VRB being the center.

For example, when the input digital signal D0 transitions from logic 0 to logic 1, a voltage at the drain node np1 of the current source MOSFET MP01 transitions from VRB to VRT and a voltage at the drain node nn1 of the current source MOSFET MN11 transitions from VRT to VRB. Since MOSFETs MP01 and MN11 have voltage-current characteristics in which the current I changes a little bit due to the change of the drain voltages even though fixed voltages such as VBP and VBN are applied to the gates, it takes time for the combined analog current to become stationary. Consequently, node voltages Vx and Vy change momentarily and take time to become stable, and the settling times of the output voltages VT and VB are long.

It is an object of the present invention to provide a semiconductor integrated circuit device such as a for-camera preprocessing LSI suitable for a semiconductor integrated circuit and having improved responsiveness. These and other objects and new features of the invention will be apparent from the following more particular description of preferred embodiments of the invention, as illustrated in the accompanying drawings.

A representative aspect of the invention disclosed in this application will be briefly described as follows. A correlated dual sampling circuit generates an output signal corresponding to a differential signal between a black level of a feedthrough part of a pixel signal generated by an image sensor device and a signal part of the pixel signal. A variable gain amplifier circuit amplifies the output signal of the correlated dual sampling circuit. An A/D converter circuit converts the amplified signal of the variable gain amplifier circuit into digital signals. A D/A converter circuit converts a feedback signal formed with the digital output signal and a clamp signal into an analog signal and providing the analog signal as feedback to the variable gain amplifier circuit or the correlated dual sampling circuit. The D/A converter circuit includes a plurality of first-conductivity-type MOSFETs as first current sources for feeding respective currents having binary weights corresponding to multiple-bit digital signals, a plurality of first-conductivity-type first differential MOSFETs which receive the multiple-bit digital signals respectively, a plurality of second-conductivity-type second differential MOSFETs in which gates and drains of the second differential MOSFETs are connected to gates and drains of the first differential MOSFETs respectively, a plurality of second-conductivity-type MOSFETs as second current sources for feeding respective currents having binary weights corresponding to the multiple-bit digital signals, the MOSFETs as second current sources being provided at source sides of the second differential MOSFETs, a differential amplifier circuit in which a predetermined bias voltage is supplied to a noninverting input terminal of the differential amplifier circuit and an inverting input terminal of the differential amplifier circuit is connected to an analog current output node which is drains connected together of one sides of the first differential MOSFETs, and a resistive element which is provided between the inverting input terminal and an output terminal of the differential amplifier circuit. The differential amplifier circuit generates a converted analog output voltage at the output terminal. A voltage equal to the bias voltage is supplied to drains of the other sides of the first differential MOSFETs.

Since the drain voltage of the current source MOSFETs is fixed even when the differential MOSFETs are switched, it becomes possible to shorten the settling time of the output voltage at the time of switching an input digital signal.

DESCRIPTION OF THE PREFERRED EMBODIMENTS

Figure 2:
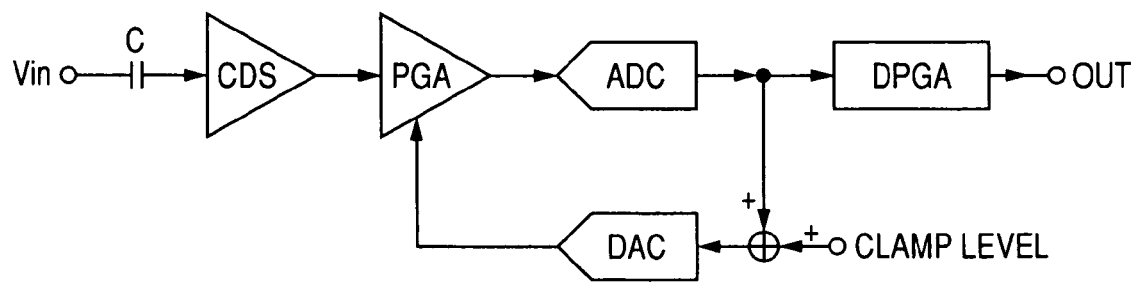
FIG. 2 is a block diagram showing an example of a for-camera preprocessing LSI to which the present invention is applied.

FIG. 2 is a block diagram showing an example of a for-camera preprocessing LSI to which the present invention is applied. An input signal Vin outputted from an image sensor device (not shown) such as a CCD is sampled by a CDS (correlated dual sampling) circuit through a coupling capacitor C. The output signal is amplified by a PGA (programmable gain amplifier). The amplified output signal is converted into digital signals by an A/D (analog-to-digital) converter (hereinafter referred to as ADC). The digitized signal is amplified by a DPGA (digital PGA) into an AFE output. For the purpose of the offset cancellation of the PGA and the ADC and arbitrary clamp-level setting, a DAC converts a signal generated by the addition (sum) of the output signal of the ADC and a clamp level (clamp setting value) into an analog signal, and adds it to the PGA.

Figure 3:
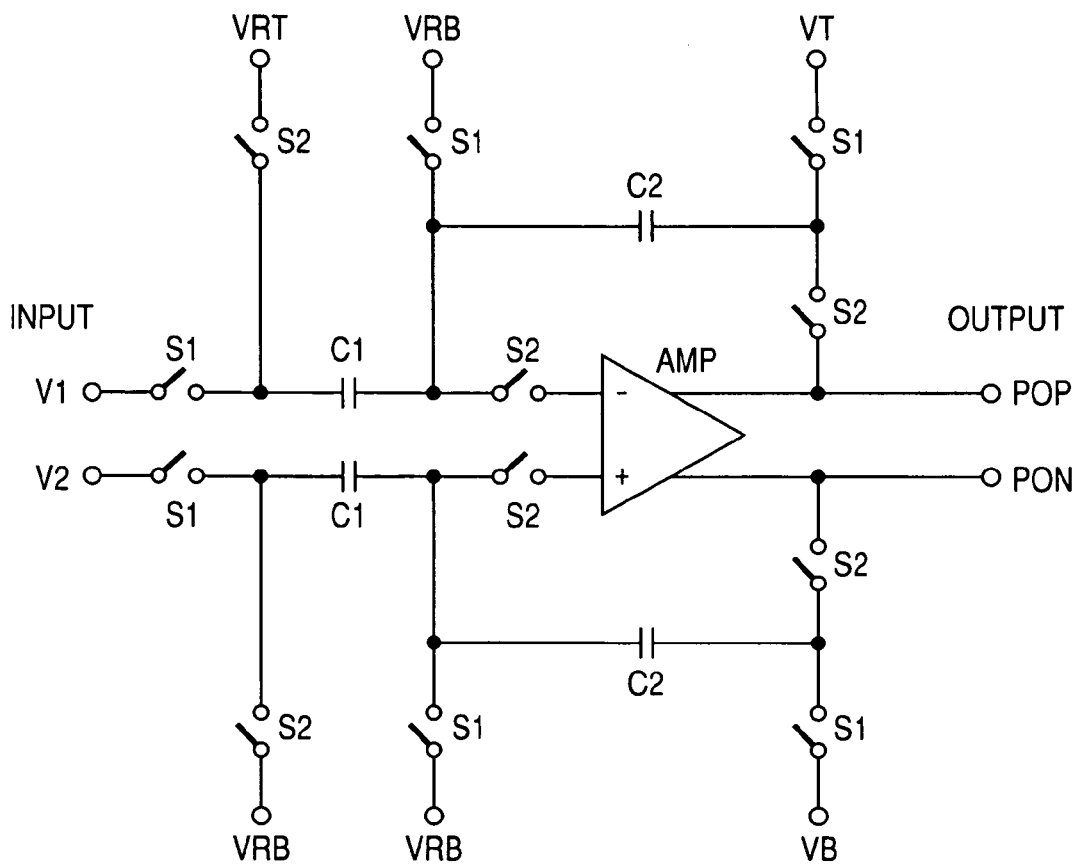
FIG. 3 is a circuit diagram showing an example of a PGA shown in FIG. 2.

FIG. 3 is a circuit diagram showing an example of the PGA shown in FIG. 2. This PGA is a switched capacitor amplifier circuit, which samples input signals V1 and V2 when switches S1 are ON, and amplifies the sampled signals when switches S2 are ON. The switches S1 and S2 are not simultaneously ON, but alternately and repeatedly ON and OFF. The relationship between the input and the output of this circuit is expressed by the following equation (1).

$$POP-PON=C1/C2\times[(V1-V2)-(VRT-VRB)]+(VT-VB) \quad (1)$$

The PGA amplifies a differential input signal V1−V2 by an amplification degree determined by the ratio of an input capacitance C1 to a feedback capacitance C2, namely, by C1/C2 times, to produce an output. Further, the PGA performs a −(VRT−VRB) level shift at the input side, and a (VT−VB) level shift at the output side. In the PGA, offset cancellation can be performed by changing the (VT−VB) level shift of the output side. At the time of processing an output from an image sensor device CCD or the like, it is convenient to put (VRT−VRB) in the center value of a variable range. For this reason, as shown in a characteristic plot of FIG. 4, it is required that VRT and VRB are at the centers of the respective ranges where VT and VB vary with the input signal (input code). It is required that a DAC provided in AFE for a camera has input-output characteristics shown in FIG. 4 and operates at high speed.

Figure 1:
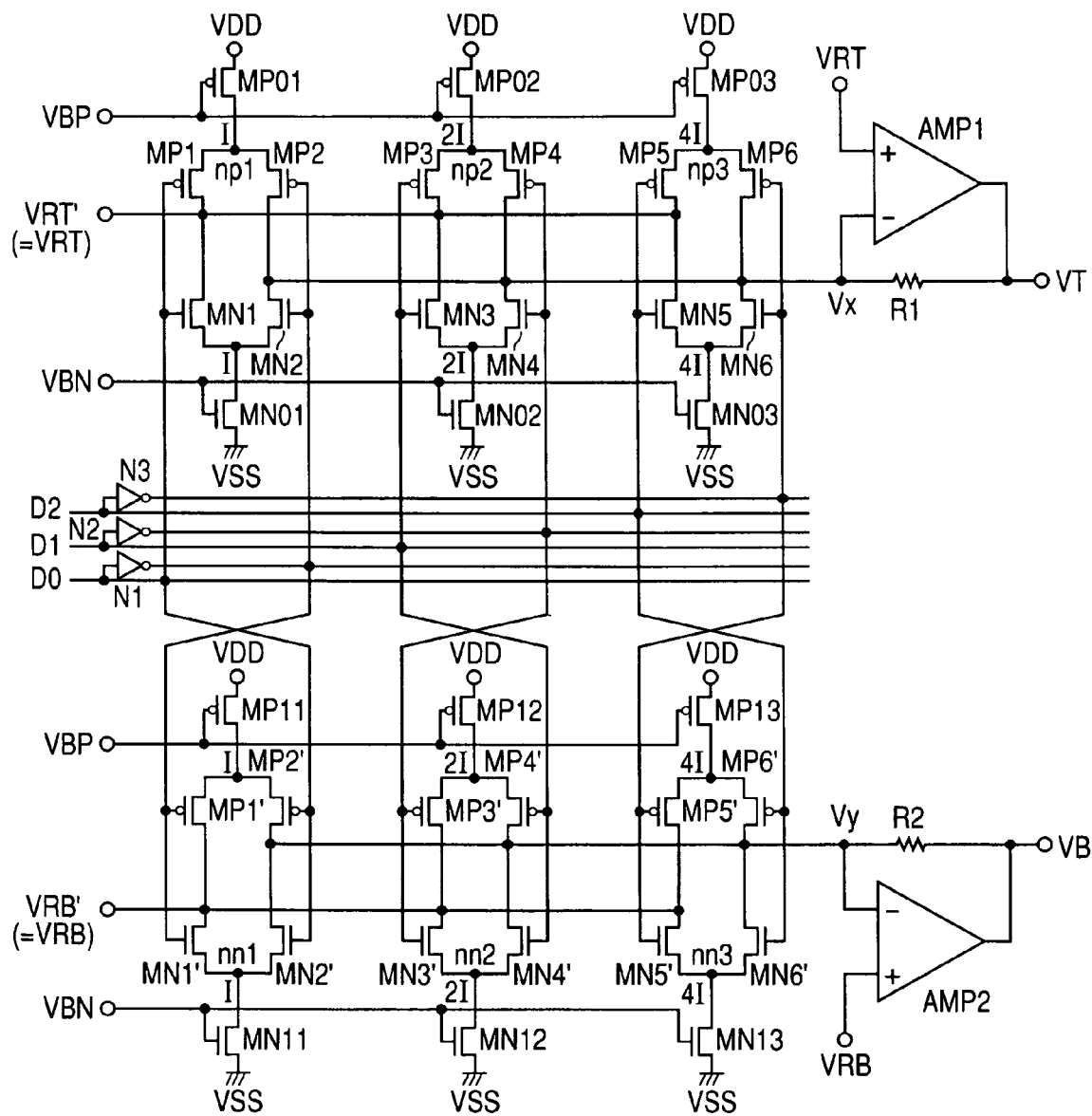
FIG. 1 is a circuit diagram of a DAC according to a first embodiment of the present invention.

FIG. 1 is a circuit diagram of a DAC according to a first embodiment of the invention. In this embodiment, a 3-bit DAC is illustrated as an example to facilitate understanding the invention. P-channel MOSFETs MP01, MP02, and MP03 for feeding currents I, 2I, and 4I having binary weights are provided at a power supply voltage VDD side. These currents I, 2I, and 4I form an analog current signal when digital signals D0, D1, and D2 and their inverted signals generated by inverter circuits N1 to N3 are supplied to the gates of P-channel type differential MOSFETs MP1 and MP2, differential MOSFETs MP3 and MP4, and differential MOSFETs MP5 and MP6 respectively for current switches. In this embodiment, in order to enhance operation speed, N-channel MOSFETs MN01, MN02, and MN03 for feeding currents I, 2I, and 4I having binary weights are provided at a circuit ground potential VSS side as well. These currents I, 2I, and 4I form an analog current signal when the digital signals D0, D1, and D2 and their inverted signals generated by the inverter circuits N1 to N3 are supplied to the gates of N-channel type differential MOSFETs MN1 and MN2, differential MOSFETs MN3 and MN4, and differential MOSFETs MN5 and MN6 respectively for current additions.

The differential MOSFETs MP1 and MP2 receive the digital signal D0 and its inverted signal at their gates respectively, and the differential MOSFETs MN1 and MN2 receive the digital signal D0 and its inverted signal at their gates respectively. The drains of the differential MOSFETs MP1 and MP2 are connected to the drains of the differential MOSFETs MN1 and MN2 respectively to produce positive current and negative current. The gates of the P-channel type differential MOSFETs MP1 and MP2 are connected to the gates of the N-channel type differential MOSFETs MN1 and MN2, respectively. Therefore, when the digital signal D0 is at a low level, the P-channel MOSFET MP1 is ON and the corresponding N-channel MOSFET MN1 is OFF. Since the inverted signal of the digital signal D0 is high, the P-channel MOSFET MP2 is OFF and the N-channel MOSFET MN2 is ON. Accordingly, the current I produced at the P-channel MOSFET MP01 flows through the P-channel MOSFET MP1 to be outputted as a positive current, whereas the current I produced at the N-channel MOSFET MN01 flows through the N-channel MOSFET MN2 to be outputted as a negative current.

Further, the differential MOSFETs MP3 and MP4 receive the digital signal D1 and its inverted signal at their gates respectively, and the differential MOSFETs MN3 and MN4 receive the digital signal D1 and its inverted signal at their gates respectively. The drains of the differential MOSFETs MP3 and MP4 are connected to the drains of the differential MOSFETs MN3 and MN4 respectively to produce positive current and negative current. Furthermore, the differential MOSFETs MP5 and MP6 receive the digital signal D2 and its inverted signal at their gates respectively, and the differential MOSFETs MN5 and MN6 receive the digital signal D2 and its inverted signal at their gates respectively. The drains of the differential MOSFETs MP5 and MP6 are connected to the drains of the differential MOSFETs MN5 and MN6 respectively to produce positive current and negative current. Since the drains of the differential MOSFETs MP2, MN2-MP4, MN4-MP6, and MN6 are connected together, the currents I, 2I, and 4I having binary weights are added to each other to be an analog current signal of the positive or negative current. These positive and negative currents flow through a resistor R1 provided between the inverting input terminal (−) and the output terminal of a differential amplifier circuit AMP1, thus producing an analog voltage VT at the output terminal of the differential amplifier circuit AMP1. A bias voltage VRT is supplied to the noninverting input terminal (+) of the differential amplifier circuit AMP1. Thereby, the differential amplifier circuit AMP1 produces the output voltage VT which becomes a positive or negative voltage in accordance with a positive or negative current flowing through the resistor R1, with the bias voltage VRT being the center.

In this embodiment, since the drains of the differential MOSFETs MP1, MN1-MP3, MN3-MP5, and MN5 are connected together, the currents I, 2I, and 4I are added to each other to be an analog current signal of the positive or negative current that is in opposite phase to the above current. However, this analog current signal is not used as an analog output signal. Further, a bias voltage VRT' as large as the bias voltage VRT is applied to the drains of the MOSFETs MP1, MN1-MP3, MN3-MP5, and MN5. Although VRT' should be equal to VRT ideally, the bias voltage VRT' is not necessarily limited thereto and may have such a small potential difference that the changes in the drain voltages of the current source MOSFETs MP01 to MP03 at the time of switching the differential MOSFETs do not present a substantial problem.

Figure 7:
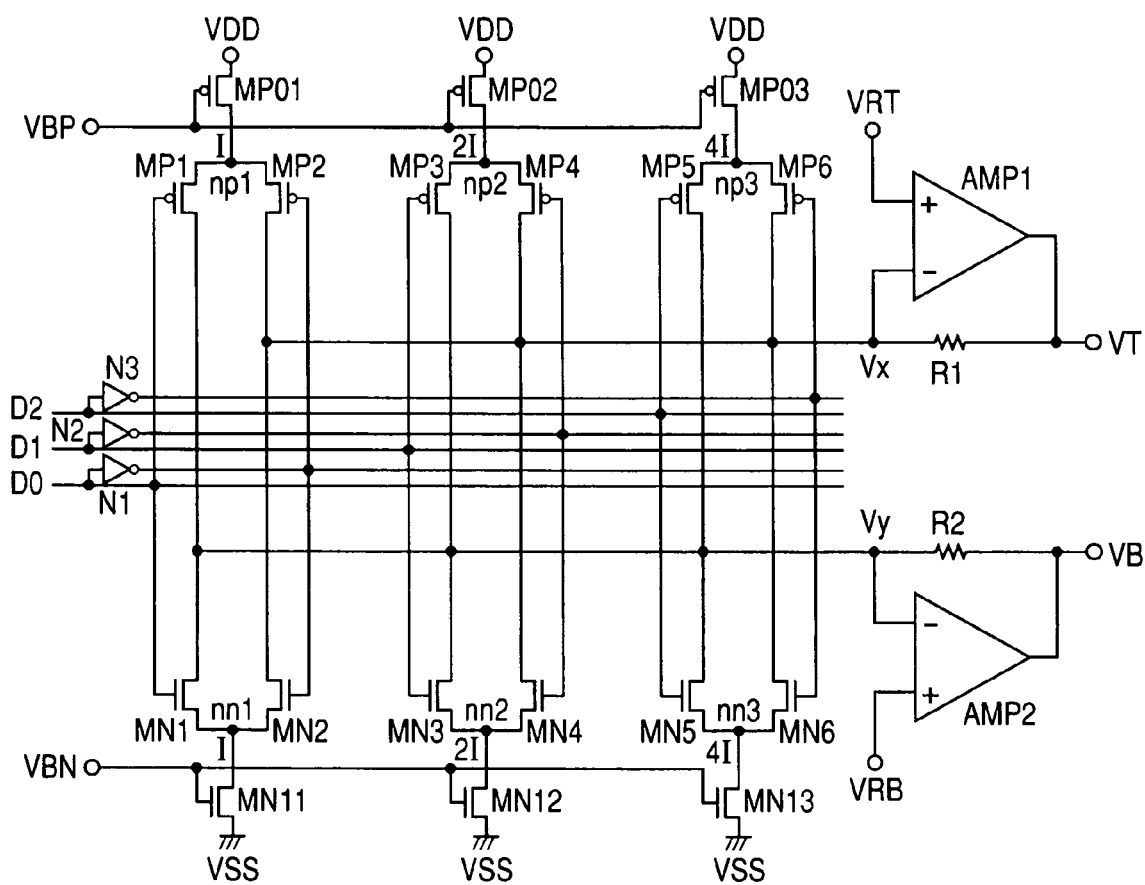
FIG. 7 is a circuit diagram of a DAC that has previously been investigated by the present inventors.

Thereby, for example, when the input digital signal D0 transitions from logic 0 to logic 1, a voltage at the drain node np1 of the current source MOSFET MP01 does not transition from VRB to VRT and a voltage at the drain node nn1 of the current source MOSFET MN11 does not transition from VRT to VRB, unlike the circuit shown in FIG. 7, and the voltages are maintained at VRT or VRT' and at VRB or VRB', respectively. Consequently, it does not take time for the combined analog current to become stationary when one of the input digital signals D0 to D2 transitions. Thus, a node voltage Vx at the inverting input terminal (−) of the differential amplifier circuit AMP1 is stably equal to the bias voltage VRT at the noninverting input terminals (+), with the input terminals imaginarily short-circuited, so that it is possible to shorten the settling time of the output voltage VT resulting from a voltage drop across the resistor R1.

A circuit similar to the foregoing is provided for the output voltage VB. That is, N-channel MOSFETs MN11, MN12, and MN13 for feeding currents I, 2I, and 4I having binary weights are provided at a circuit ground potential VSS side. Corresponding to the MOSFETs MN11, MN12, and MN13, there are provided N-channel differential MOSFETs MN1' and MN2', differential MOSFETs MN3' and MN4', and differential MOSFETs MN5' and MN6', P-channel type current source MOSFETs MP11, MP12, and MP13, and P-channel differential MOSFETs MP1' and MP2', differential MOSFETs MP3' and MP4', and differential MOSFETs MP5' and MP6'. Since the drains of the differential MOSFETs MP2', MN2'-MP4', MN4'-MP6', and MN6' are connected together, the currents I, 2I, and 4I are added to each other to be an analog current signal of the positive or negative current. These positive and negative currents flow through a resistor R2 provided between the inverting input terminal (−) and the output terminal of a differential amplifier circuit AMP2, thus producing an analog voltage VB at the output terminal of the differential amplifier circuit AMP2. A bias voltage VRB is supplied to the noninverting input terminal (+) of the differential amplifier circuit AMP2. Thereby, the differential amplifier circuit AMP2 produces the output voltage VB which becomes a positive or negative voltage in accordance with a positive or negative current flowing through the resistor R2, with the bias voltage VRB being the center.

Figure 4:
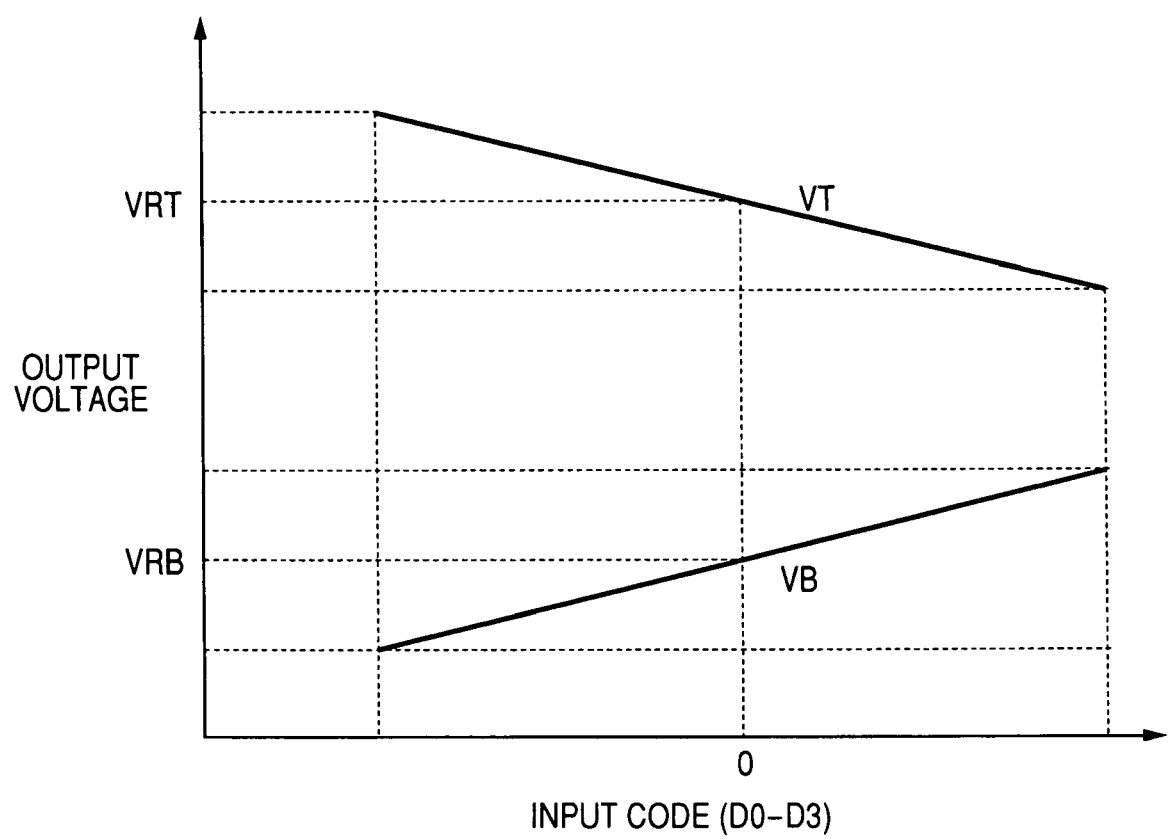
FIG. 4 is an input-output characteristic plot of assistance in explaining the operation of a DAC according to the invention.

Since the output voltage VB is in opposite phase to the output voltage VT as shown in the characteristic plot of FIG. 4, the digital signals D0, D1, and D2 and their inverted signals generated by the inverter circuits N1 to N3 are supplied in reversed connections from those for producing the output voltage VT. In the circuit for producing the output voltage VB, a bias voltage VRB' as large as the bias voltage VRB is applied to the drain connection line of the differential MOSFETs MP1', MN1'-MP3', MN3'-MP5', and MN5' which are not used for producing an analog output signal. Although VRB' should be equal to VRB ideally, the bias voltage VRB' is not necessarily limited thereto and may have such a small potential difference that the changes in the voltages of the drain nodes nn1 to nn3 of the current source MOSFETs MN11 to MN13 at the time of switching the differential MOSFETs do not present a substantial problem, as in the case of the foregoing. Thus, a node voltage Vy at the inverting input terminal (−) of the differential amplifier circuit AMP2 is stably equal to the bias voltage VRB at the noninverting input terminals (+), with the input terminals imaginarily short-circuited, so that it is possible to shorten the settling time of the output voltage VB resulting from a voltage drop across the resistor R2.

The two DACs corresponding to the two differential amplifier circuits AMP1 and AMP2 can produce the output voltages VT and VB corresponding to the input codes as shown in FIG. 4. This configuration achieves high-speed operation, and is suitable for a semiconductor integrated circuit because the direct feedback of the output voltages VT and VB to the PGA eliminates the need for the capacitor such as described in the patent document 1.

Figure 5:
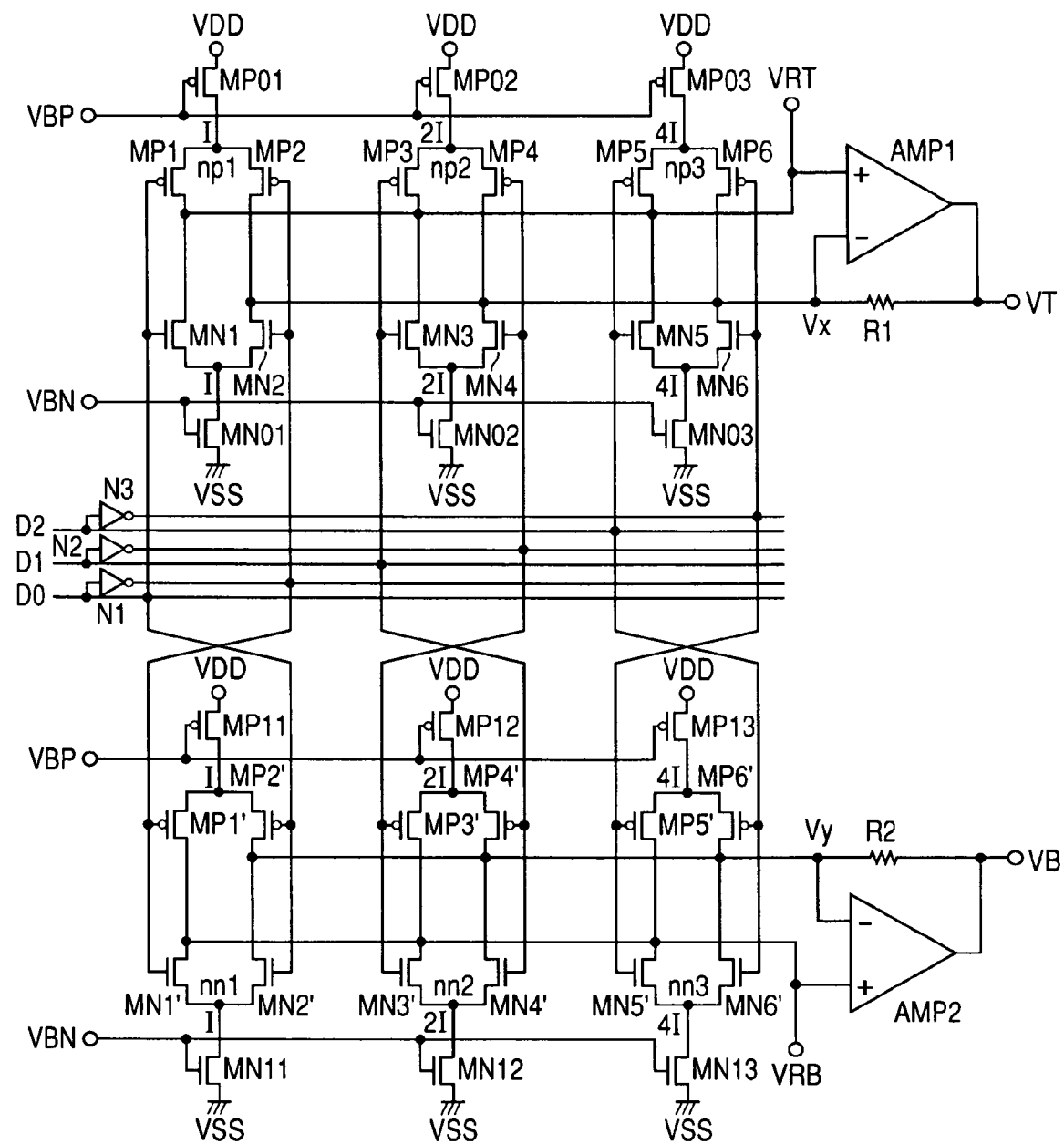
FIG. 5 is a circuit diagram of a DAC according to a second embodiment of the invention.

FIG. 5 is a circuit diagram of a DAC according to a second embodiment of the invention. In this embodiment, the bias voltages VRT' and VRB' shown in FIG. 1 are eliminated, and instead the bias voltages VRT and VRB themselves are used. That is, the drains of the MOSFETs MP1, MP3, MP5, MN1, MN3, and MN5 are connected to the noninverting input terminal (+) of the differential amplifier circuit AMP1 to be supplied with the bias voltage VRT. In the same way, the bias voltage VRB supplied to the noninverting input terminal (+) of the differential amplifier circuit AMP2 is connected to the drains connected together of the differential MOSFETs MP1', MP3', MP5', MN1', MN3', and MN5'.

Figure 6:
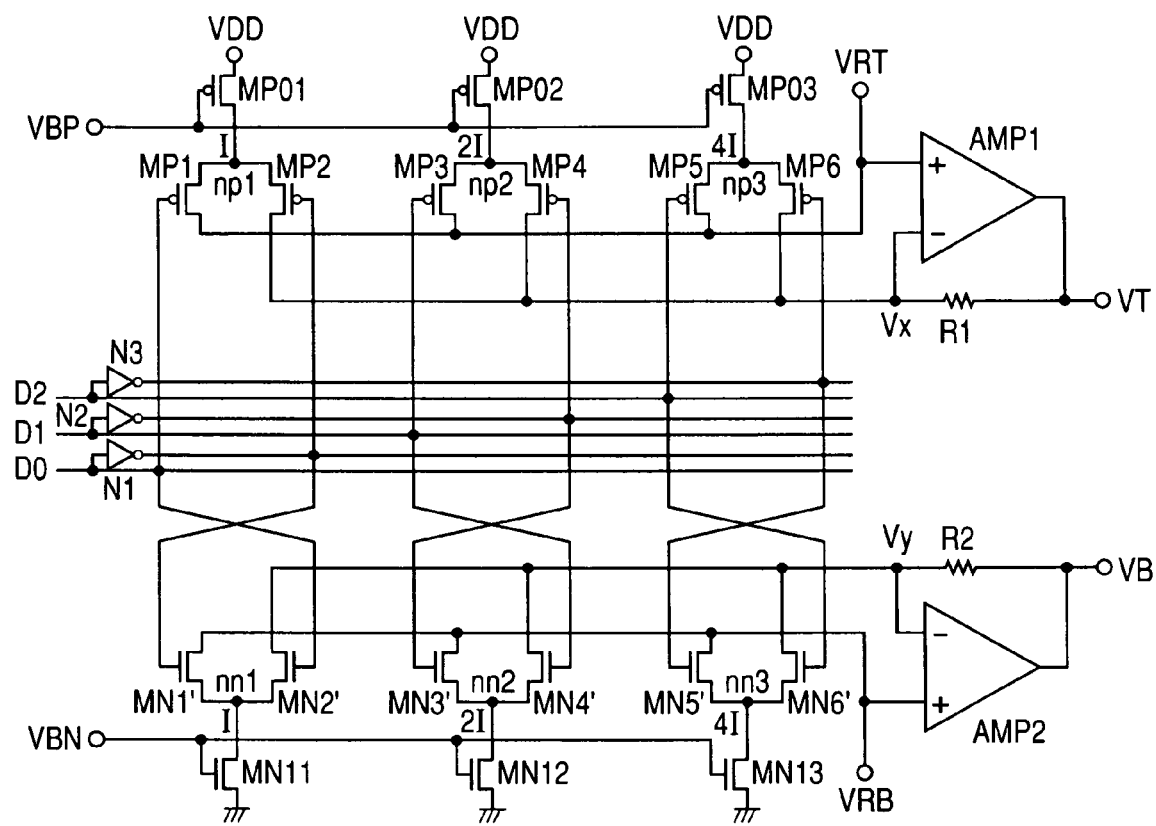
FIG. 6 is a circuit diagram of a DAC according to a third embodiment of the invention.

FIG. 6 is a circuit diagram of a DAC according to a third embodiment of the invention. In this embodiment, for the differential amplifier circuit AMP1 shown in FIG. 5, the N-channel type current source MOSFETs for supplying negative current and the corresponding differential MOSFETs are eliminated. Further, for the differential amplifier circuit AMP2, the P-channel type current source MOSFETs for supplying positive current and the corresponding differential MOSFETs are eliminated. In this case, the output voltages VT and VB are not produced in the left half of the characteristic plot of FIG. 4. Thus, offsets are added with respect to input digital signals, and there are performed the offset cancellation of the PGA and the ADC and the setting of the clamp level of a black level, using the characteristics in the left half.

While the invention made by the present inventors has been described specifically based on the above embodiments, the invention is not limited to the embodiments and includes various modifications without departing from the scope and sprit of the invention. For example, the circuit for producing a feedback signal to be inputted to the DAC can be any other circuit as long as it can perform the offset cancellation of the PGA and the ADC and set the clamp level of a black level. Further, the circuit may provide a feedback signal to the CDS to cancel the offset of the CDS. The CDS, the PGA, and the ADC can have a variety of specific circuit configurations. The invention can be widely applied to a semiconductor integrated circuit device intended for a for-camera preprocessing LSI.

What is claimed is:

1. A semiconductor integrated circuit device comprising:
   a correlated dual sampling circuit for sampling and holding a signal corresponding to a black level of a feedthrough part of a pixel signal generated by an image sensor device and generating an output signal corresponding to a differential signal between the sampled and held black level and a signal part of the pixel signal;
   a variable gain amplifier circuit for amplifying the output signal of the correlated dual sampling circuit;
   an A/D converter circuit for receiving an amplified signal from the variable gain amplifier circuit; and
   a D/A converter circuit for converting a received feedback signal formed with an output signal of the A/D converter circuit and a clamp signal into an analog signal and providing the analog signal as feedback to the variable gain amplifier circuit or the correlated dual sampling circuit,
   wherein the D/A converter circuit includes
   a plurality of first-conductivity-type MOSFETs as first current sources for feeding respective currents having binary weights corresponding to multiple-bit digital signals,
   a plurality of first-conductivity-type first differential MOSFETs which receive the multiple-bit digital signals respectively,
   a plurality of second-conductivity-type second differential MOSFETs in which gates and drains of the second differential MOSFETs are connected to gates and drains of the first differential MOSFETs respectively,
   a plurality of second-conductivity-type MOSFETs as second current sources for feeding respective currents having binary weights corresponding to the multiple-bit digital signals, the MOSFETs as second current sources being provided at source sides of the second differential MOSFETs,
   a differential amplifier circuit in which a predetermined bias voltage is supplied to a noninverting input terminal of the differential amplifier circuit and an inverting input terminal of the differential amplifier circuit is connected to an analog current output node to which the drains are connected on one of the sides of the first differential MOSFETs, and
   a resistive element which is provided between the inverting input terminal and an output terminal of the differential amplifier circuit, and
   the differential amplifier circuit generates a converted analog output voltage at the output terminal.

2. The semiconductor integrated circuit device according to claim 1,
   wherein a voltage equal to the bias voltage is supplied to drains of the other sides of the first differential MOSFETs, and
   the drains of the other sides of the first differential MOSFETs are connected to the noninverting input terminal of the differential amplifier circuit.

3. The semiconductor integrated circuit device according to claim 2,
   wherein in the variable gain amplifier circuit,
   an input signal is taken in an input capacitance with first timing,
   a voltage gain is set by the ratio of the input capacitance to a feedback capacitance with second timing, and
   a feedback signal is applied to the feedback capacitance during the first timing period.

4. The semiconductor integrated circuit device according to claim 3,
   wherein the variable gain amplifier circuit includes
   a fully differential amplifier circuit having a noninverting input terminal, an inverting input terminal, a noninverting output terminal, and an inverting output terminal,
   first and second input sections having the input capacitance, and
   first and second feedback sections having the feedback capacitance,
   wherein the D/A converter circuit includes a first circuit and a second circuit which include the MOSFETs as first current sources, the first differential MOSFETs, the MOSFETs as second current sources, the differential amplifier circuit, and the resistive element, and
   wherein the first circuit in which a first bias voltage is supplied to the noninverting input terminal of the differential amplifier circuit generates a first analog output signal and provides the first analog output signal as feedback to the first feedback section, and the second circuit in which a second bias voltage different from the first bias voltage is supplied to the noninverting input terminal of the differential amplifier circuit generates a second analog output signal and provides the second analog output signal as feedback to the second feedback section.

5. The semiconductor integrated circuit device according to claim 4, further comprising a digital variable gain amplifier circuit which receives an output signal of the A/D converter circuit.

6. A semiconductor integrated circuit device comprising:

a correlated dual sampling circuit for sampling and holding a signal corresponding to a black level of a feedthrough part of a pixel signal generated by an image sensor device and generating an output signal corresponding to a differential signal with respect to a signal part of the pixel signal;

a variable gain amplifier circuit for amplifying the output signal of the correlated dual sampling circuit;

an A/D converter circuit for receiving an amplified signal from the variable gain amplifier circuit; and a D/A converter circuit for converting a received feedback signal formed with an output signal of the A/D converter circuit and a clamp signal into an analog signal and providing the analog signal as feedback to the variable gain amplifier circuit or the correlated dual sampling circuit, wherein the D/A converter circuit includes a plurality of first-conductivity-type MOSFETs as first current sources for feeding respective currents having binary weights corresponding to multiple-bit digital signals, a plurality of first-conductivity-type first differential MOSFETs which receive the multiple-bit digital signals respectively, a differential amplifier circuit in which a predetermined bias voltage is supplied to a noninverting input terminal of the differential amplifier circuit and an inverting input terminal of the differential amplifier circuit is connected to an analog current output node to which drains are connected on one of the sides of the first differential MOSFETs, and a resistive element which is provided between the inverting input terminal and an output terminal of the differential amplifier circuit, and the differential amplifier circuit generates a converted analog output voltage at the output terminal.

7. The semiconductor integrated circuit device according to claim 6, wherein the bias voltage is supplied to drains of the other sides of the first differential MOSFETs, and wherein in the variable gain amplifier circuit, an input signal is taken in an input capacitance with first timing, a voltage gain is set by the ratio of the input capacitance to a feedback capacitance with second timing, and a feedback signal is applied to the feedback capacitance during the first timing period.

8. The semiconductor integrated circuit device according to claim 7, wherein the variable gain amplifier circuit includes a fully differential amplifier circuit having a noninverting input terminal, an inverting input terminal, a noninverting output terminal, and an inverting output terminal, first and second input sections having the input capacitance, and first and second feedback sections having the feedback capacitance, wherein the D/A converter circuit includes a first circuit which includes the MOSFETs as first current sources, the first differential MOSFETs, the differential amplifier circuit, and the resistive element, and a second circuit which includes a plurality of second-conductivity-type MOSFETs as second current sources for feeding respective currents having binary weights corresponding to multiple-bit digital signals, a plurality of second-conductivity-type second differential MOSFETs which receive the multiple-bit digital signals respectively, a differential amplifier circuit in which a predetermined bias voltage is supplied to a noninverting input terminal of the differential amplifier circuit and an inverting input terminal of the differential amplifier circuit is connected to an analog current output node to which the drains are connected on one of the sides of the second differential MOSFETS, and a resistive element which is provided between the inverting input terminal and an output terminal of the differential amplifier circuit, and in the second circuit, the differential amplifier circuit generates a converted analog output voltage at the output terminal, and the bias voltage is supplied to drains of the other sides of the second differential MOSFETs, and wherein the first circuit in which a first bias voltage is supplied to the noninverting input terminal of the differential amplifier circuit generates a first analog output signal and provides the first analog output signal as feedback to the first feedback section, and the second circuit in which a second bias voltage different from the first bias voltage is supplied to the noninverting input terminal of the differential amplifier circuit generates a second analog output signal and provides the second analog output signal as feedback to the second feedback section.

9. The semiconductor integrated circuit device according to claim 8, further comprising a digital variable gain amplifier circuit which receives an output signal of the A/D converter circuit.

* * * * *